US008286066B2

United States Patent
Bueb et al.

(10) Patent No.: US 8,286,066 B2
(45) Date of Patent: Oct. 9, 2012

(54) NON-VOLATILE MEMORY WITH BI-DIRECTIONAL ERROR CORRECTION PROTECTION

(75) Inventors: Christopher Bueb, Folsom, CA (US); Shaul Halabi, Mevasseret Zion (IL)

(73) Assignee: Micron Technology, Inc., Boise, ID (US)

( * ) Notice: Subject to any disclaimer, the term of this patent is extended or adjusted under 35 U.S.C. 154(b) by 680 days.

(21) Appl. No.: 12/467,965

(22) Filed: May 18, 2009

(65) Prior Publication Data

US 2010/0293434 A1    Nov. 18, 2010

(51) Int. Cl.
*G06F 11/00*    (2006.01)

(52) U.S. Cl. ........................................ 714/801

(58) Field of Classification Search ............... 714/801
See application file for complete search history.

(56) References Cited

U.S. PATENT DOCUMENTS

| 7,080,309 B2 | 7/2006 | Sharma | |
| 7,337,385 B2 * | 2/2008 | Harada | 714/781 |
| 7,447,948 B2 | 11/2008 | Galbi et al. | |
| 7,539,052 B2 | 5/2009 | Aritome | |
| 8,000,403 B2 * | 8/2011 | Shimizu et al. | 375/262 |
| 2007/0029016 A1 * | 2/2007 | Gheorghe | 148/552 |
| 2007/0067705 A1 * | 3/2007 | Kim | 714/801 |
| 2008/0168320 A1 | 7/2008 | Cassuto et al. | |
| 2009/0024903 A1 | 1/2009 | Bueb | |

FOREIGN PATENT DOCUMENTS

| EP | 1912121 A1 | 4/2008 |
| WO | 01/63613 A1 | 8/2001 |

OTHER PUBLICATIONS

U.S. Appl. No. 12/333,100, filed Dec. 11, 2008, Bueb.
U.S. Appl. No. 12/427,706, filed Apr. 21, 2009, Bueb.
Sun et al., "Design of on-chip error correction systems for multilevel NOR and NAND flash memories", IET Circuits Devices Syst., 2007, 1, (3), pp. 241-249.

* cited by examiner

*Primary Examiner* — Albert Decady
*Assistant Examiner* — Enam Ahmed
(74) *Attorney, Agent, or Firm* — Knobbe, Martens, Olson & Bear LLP (57) ABSTRACT

Embodiments of the present disclosure provide methods and apparatuses related to NVM devices with bi-directional error correction protection. In some embodiments, multiple multi-level parity cells are used to represent parity values stored in codewords of an NVM device. Other embodiments may be described and claimed.

18 Claims, 5 Drawing Sheets

| Times of Write Parity Value | 1st or higher | 2nd or higher | 3rd or higher |
|---|---|---|---|
| P0 | L0 - L0 | L2 - L2 | L1 - L3 |
| P1 | L0 - L1 | L1 - L2 | L2 - L3 |
| P2 | L0 - L2 | L1 - L1 | L3 - L3 |
| P3 | L1 - L0 | L0 - L3 | L3 - L2 |

Figure 1

| Parity Value \ Times of Write | 1st or higher | 2nd or higher | 3rd or higher | 4th or higher | 5th or higher | 6th or higher |
|---|---|---|---|---|---|---|
| P0 | L0-L0-L0 | L1-L1-L1 | L1-L1-L1 | L2-L2-L2 | L2-L2-L2 | L3-L3-L3 |
| P1 | L0-L0-L1 | L1-L1-L0 | L1-L1-L2 | L2-L2-L1 | L2-L2-L3 | L3-L3-L2 |
| P2 | L0-L1-L0 | L1-L0-L1 | L1-L2-L1 | L2-L1-L2 | L2-L3-L2 | L3-L2-L3 |
| P3 | L1-L0-L0 | L0-L1-L1 | L2-L1-L1 | L1-L2-L2 | L3-L2-L2 | L2-L3-L3 |

Figure 2

| Parity Value \ Times of Write | 1st or higher | 2nd or higher | 3rd or higher | 4th or higher |
|---|---|---|---|---|
| P0 | L0-L0-L0-L0 | L0-L1-L1-L1 | L0-L1-L1-L1 | L0-L2-L2-L2 |
| P1 | L0-L0-L0-L1 | L0-L1-L1-L0 | L0-L1-L1-L2 | L0-L2-L2-L1 |
| P2 | L0-L0-L1-L0 | L0-L1-L0-L1 | L0-L1-L2-L1 | L0-L2-L1-L2 |
| P3 | L0-L1-L0-L0 | L0-L0-L1-L1 | L0-L2-L1-L1 | L0-L1-L2-L2 |

| Parity Value \ Times of Write | 5th or higher | 6th or higher | 7th or higher | Final ECC-Off |
|---|---|---|---|---|
| P0 | L0-L2-L2-L2 | L1-L2-L3-L3 | L1-L2-L3-L3 | L3-Lx-Lx-Lx |
| P1 | L1-L2-L2-L2 | L0-L2-L3-L3 | L1-L3-L3-L3 | L3-Lx-Lx-Lx |
| P2 | L0-L2-L2-L3 | L1-L2-L3-L2 | L2-L2-L3-L3 | L3-Lx-Lx-Lx |
| P3 | L0-L2-L3-L2 | L1-L2-L2-L3 | L2-L3-L3-L3 | L3-Lx-Lx-Lx |

NON-VOLATILE MEMORY WITH BI-DIRECTIONAL ERROR CORRECTION PROTECTION

FIELD

Embodiments of the present disclosure relate to the field of memory, and more particularly, to non-volatile memory (NVM) with bi-directional error correction protection.

BACKGROUND

Error correction codes (ECCs) are widely utilized to reflect data values stored in NVM devices to avoid read errors. Parity is one of the common ECC protection schemes.

For NVM devices that can only be programmed uni-directionally, such as flash memories, a series of data values may be written into data cells of a codeword within a programming cycle. Parity cells in the codewords may be used to store parity information that reflects the data value stored in the data cells. However, the parity cells can only be programmed to correspond with the data value once within a programming cycle. This is because a subsequent write operation to reflect a change of data value normally requires the parity cell of the codeword to be reversely programmed which cannot be achieved by the uni-directionally programmed parity cell of the NVM devices within the programming cycle. So, currently when data cells in a codeword are programmed for a second time, the corresponding parity cell has to be disabled to avoid errors caused by unmatched parity value.

For NVM devices that can be programmed bi-directionally, such as phase change memories (PCM), the parity cells in a codeword have to be programmed every time when a data value is written into the codeword, which may cause reliability problems of the parity cells.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments in which the disclosure may be practiced. It is to be understood that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

Various operations may be described as multiple discrete operations in turn, in a manner that may be helpful in understanding embodiments of the present disclosure; however, the order of description should not be construed to imply that these operations are order dependent.

For the purposes of the present disclosure, the phrase "A and/or B" means "(A), (B), or (A and B)." For the purposes of the present disclosure, the phrase "A, B, and/or C" means "(A), (B), (C), (A and B), (A and C), (B and C), or (A, B and C)."

Various logic blocks may be introduced and described in terms of an operation provided by the blocks. These logic blocks may include hardware, software, and/or firmware elements in order to provide the described operations. While some of these logic blocks may be shown with a level of specificity, e.g., providing discrete elements in a set arrangement, other embodiments may employ various modifications of elements/arrangements in order to provide the associated operations within the constraints/objectives of a particular embodiment.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

In various embodiments, the codewords of NVM devices with bi-directional ECC protection may employ two or more multi-level parity cells to reflect data values stored in corresponding data cells of the same codewords. In one embodiment, there may be two four-level parity cells in each codeword. The four levels of each parity cell may be defined from low to high as L0, L1, L2 and L3. The parity cells may be programmed, or level-shifted, one or more levels in a programming iteration. In some embodiments, the level-shifting of the parity cells may occur uni-directionally, e.g., in an ascending direction from L0 to L3, throughout a programming cycle. A programming cycle, as used herein, may refer to a consecutive series of programming iterations upon the codeword without an intervening erase operation.

The two four-level parity cells may represent four possible parity values from low to high as P0, P1, P2 and P3 to reflect data values stored in the same codeword. In various embodiments, as will be described, the parity values may be written bi-directionally through uni-directional level-shifts of the parity cells.

In various embodiments, the parity cells may be programmed at least three times within a single programming cycle to bi-directionally write a parity value into the codeword at each time. Each parity value may be represented by a cell state combination Lx-Ly at each time that the parity cells are programmed within the programming cycle.

Figure 1:
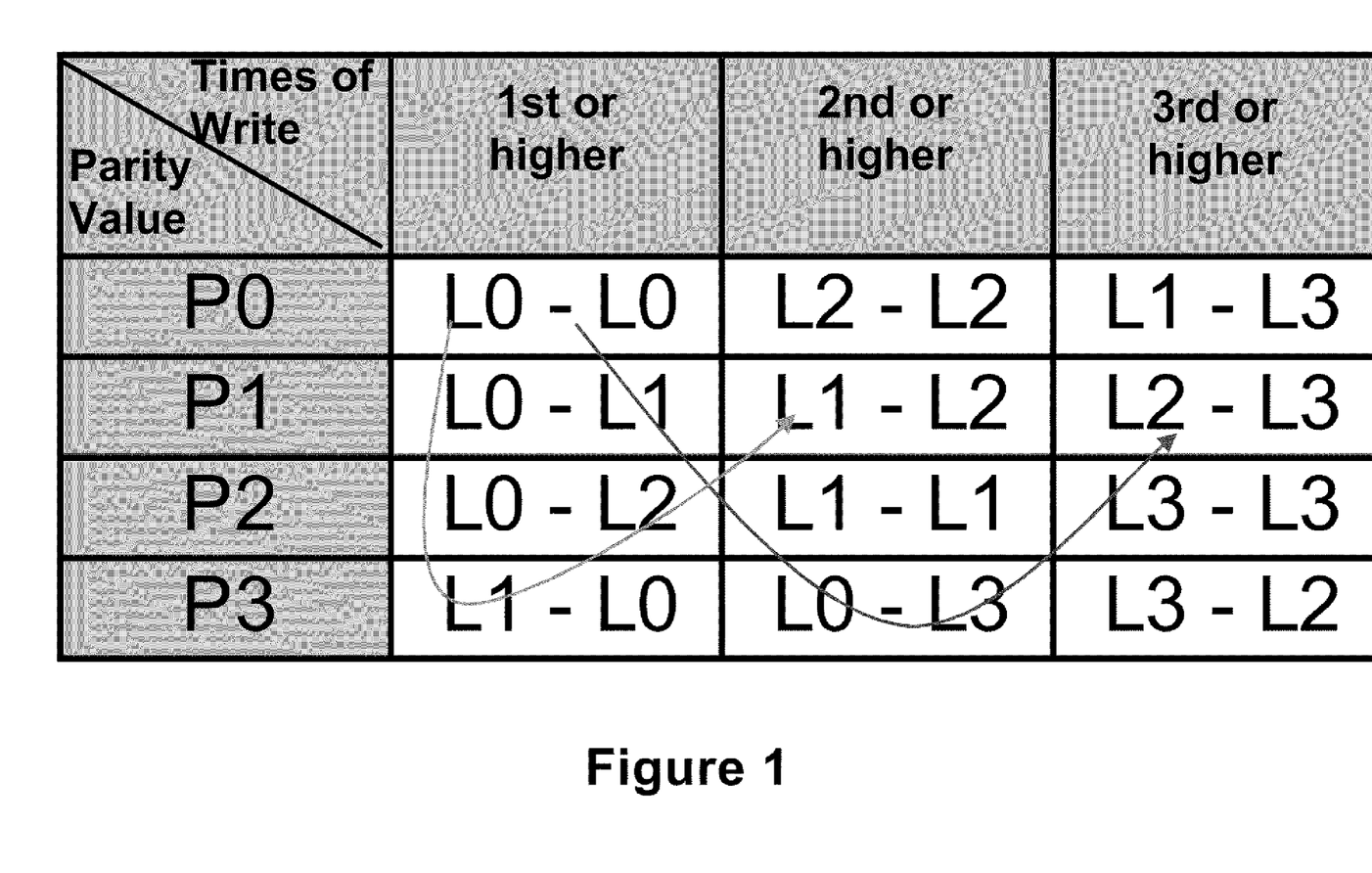
FIG. 1 is a table presenting parity values and corresponding cell state combinations for an NVM device with bi-directional ECC protection in accordance with an embodiment.

FIG. 1 is a table presenting the corresponding relationship between the four parity values and the cell state combinations representing the parity values at each time that the parity cells are programmed within a programming cycle. In one embodiment, P0 may be the parity value to be written into the codeword first. As illustrated in table of FIG. 1, both of the parity cells may be set to the first level as L0-L0 to represent parity value P0. In one embodiment, any of the parity values P0-P3 may be written to the codeword when the parity cells are programmed for the second time because the parity cells may be programmed to any of the cell state combinations in the second column in the table of FIG. 1 starting from L0-L0.

In one embodiment, P3 may be the second parity value that is supposed to be written to the codeword. As illustrated in FIG. 1, the first parity cell may stay at the first level L0 and the second parity cell may be programmed to the fourth level L3. In one embodiment, starting from L0-L3 in the second column, the parity cells may be programmed to cell state combinations in the third column of the table in FIG. 1 to represent any of P0-P2 as the third parity value. In another embodiment, if the third parity value supposed to be written is still P3, the parity cells can stay with the current cell state combination L0-L3.

In one embodiment, the third parity value to be written to the codeword may be P1. Such a switch from P3 to P1 may not be achieved with any existing NVM device within a programming cycle. However, in this embodiment, the first parity cell may be programmed from the first level L0 to the third level L2 and the second parity cell may stay at the fourth level L3, so that the parity value P1 may be written into the codeword to replace P3. In one embodiment, as illustrated in FIG. 1, the parity cells cannot be further programmed to represent any of P0-P3 and therefore the ECC protection should be turned off until the block containing the codeword is erased.

In various embodiments, codewords each including two four-level parity cells may be programmed more than three times within a programming cycle. In one embodiment, the first parity value supposed to be written in may still be P0 and the parity cells may be programmed to L0-L0 to represent P0. In one embodiment, second parity value to be written in may still be P3. In one embodiment, the parity cells may be programmed from L0-L0 to L1-L0 in the first column to represent parity value P3. In another embodiment, the third parity value to be written to the codeword may still be P1. In one embodiment, to write the third parity value P1 into the codeword, the first parity cell may be kept at the second level L1 and the second parity cell may be programmed to the third level L2. In one embodiment, after the third write the parity cells can still be further programmed for a fourth time to any of the cell state combinations in the third column of FIG. 1 to represent any of the parity values P0-P3. Therefore, a four-time bi-directional ECC protection may be enabled with two four-level parity cells.

Figure 2:
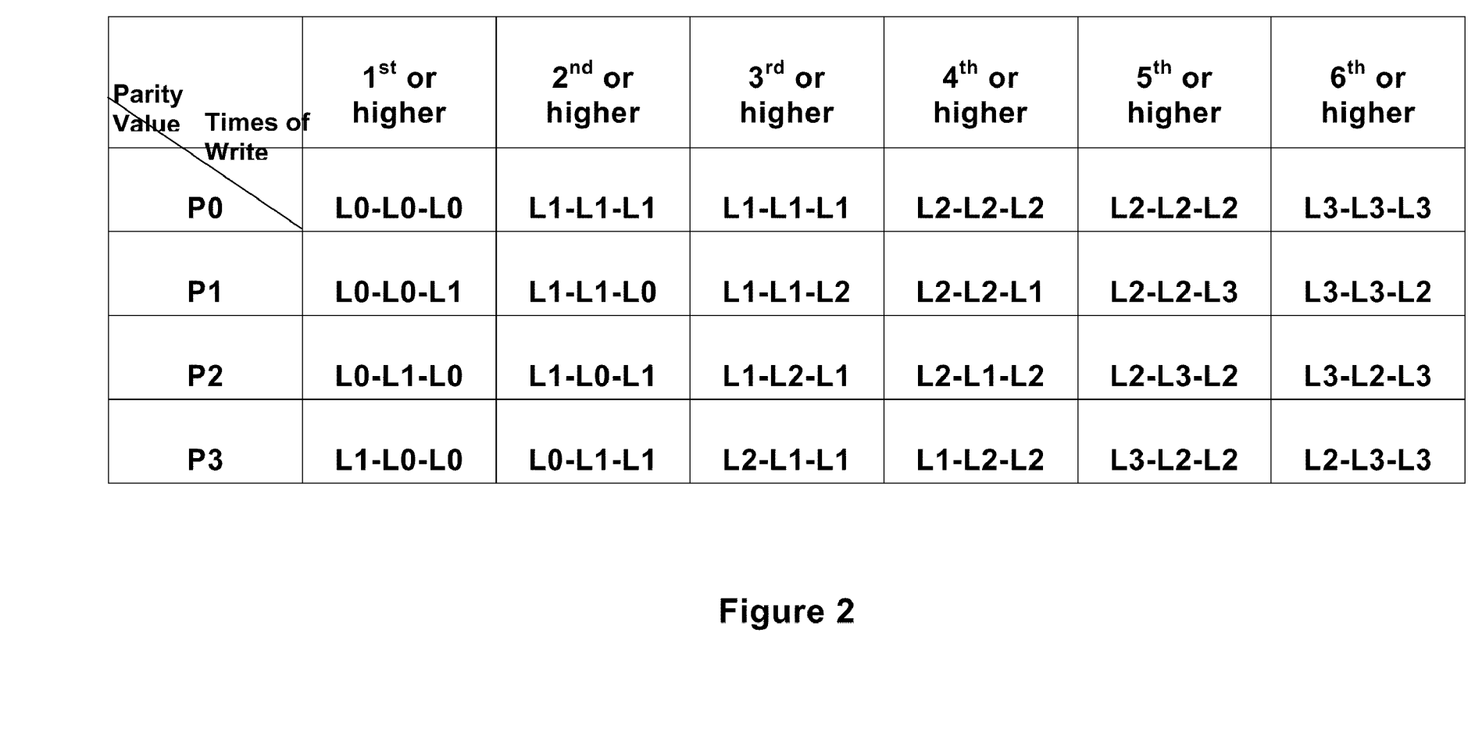
FIG. 2 is a table presenting parity values and corresponding cell state combinations for an NVM device with bi-directional ECC protection in accordance with another embodiment.

In one embodiment, each of the codewords in an NVM device with bi-directional ECC protection may have three four-level parity cells. FIG. 2 is a table presenting the corresponding relationship between four parity values and cell state combinations representing the four parity values at each time that the three parity cells are programmed. As illustrated in FIG. 2, at least six-time bi-directional ECC protection may be available based on such configuration.

Figure 3:
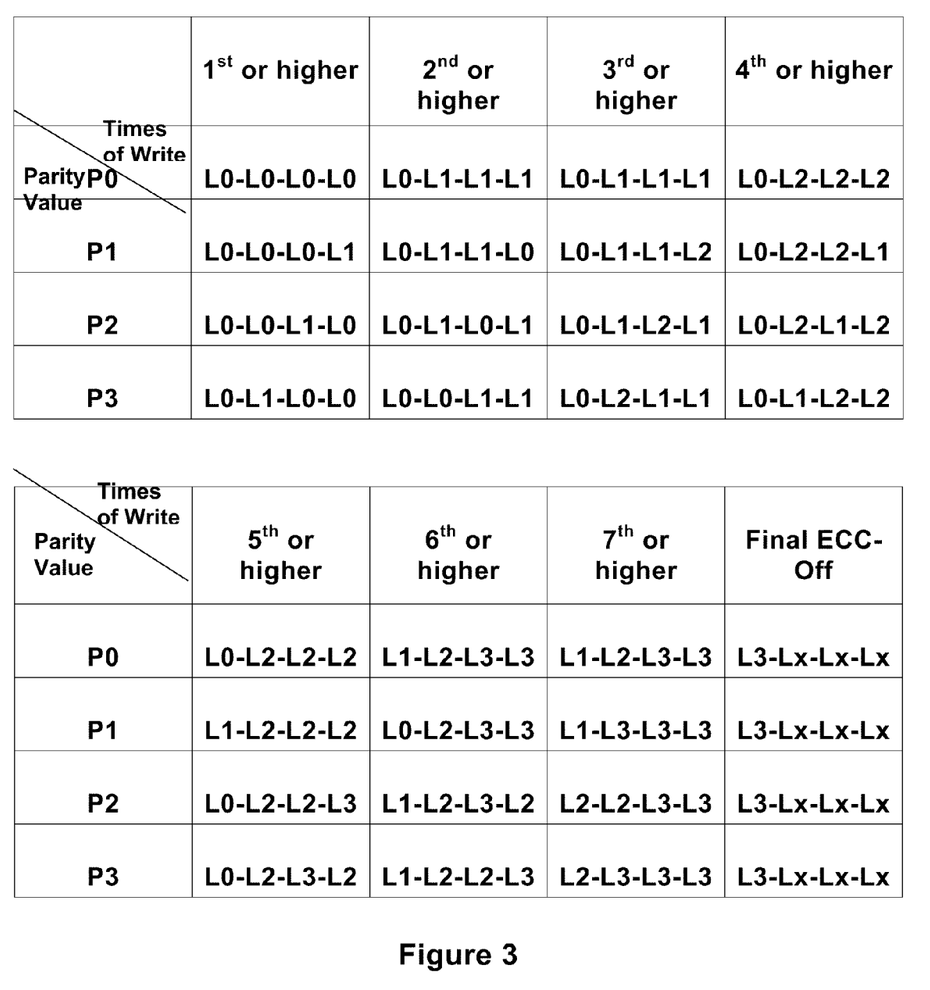
FIG. 3 is a table presenting parity values and corresponding cell state combinations for an NVM device with bi-directional ECC protection in accordance with another embodiment.

In another embodiment, each of the codewords in an NVM device with bi-directional ECC protection may have four four-level parity cells. FIG. 3 is a table presenting the corresponding relationship between four parity values and cell state combinations representing the four parity values at each time that the four parity cells are programmed. As illustrated in FIG. 3, at least seven-time bi-directional ECC protection may be available based on such configuration. In one embodiment, there may be an ECC-off state indicating that the ECC protection is off when the cell state combination is started with L3. As illustrated in FIG. 3, in the $7^{th}$ column the second, third and fourth parity cells are exhausted (the definition of "exhausted" will be further explained later in the specification) and only the first parity cell left to be programmable may not be enough to represent four parity values in a next write. Therefore, the cell state combinations started with L3 may be defined to be a sign indicating that the ECC protection should be turned off.

In various embodiments, for each codeword of an NVM device, there may be X parity cells and each parity cell may have Y levels. The X number of Y-level parity cells may collaboratively represent M parity values and the X parity cells may be programmed at least N times to represent any of the M parity values within a programming cycle. In particular, the M parity values may form a sequence and each have a rank in the sequence. By configuring the X number of Y-level parity cells, parity values that have a lower rank in the sequence than the parity value existing in the codeword may be written to the codeword within the same programming cycle. Users may decide the values for integers X, Y and M based on different applications and design considerations.

The embodiments and figures in the instant application are used as illustrations and there may be various possible cell state combinations for codewords with various numbers of multi-level parity cells. In various embodiments, there may be one or more criteria to be taken into consideration in designing the cell state combinations to achieve maximum number of bi-directional ECC protection within a programming cycle.

In one embodiment, for a given $K^{th}$ write (where K is an integer), there may be a "number of level shifts" which represents a sum of levels for each cell state combination. For example, for the first column in FIG. 1, the cell state combination representing P0 is L0-L0 and the number of level shifts for this cell state combination may be 0+0=0. In another embodiment, in the same column the cell state combination representing the parity value P2 is L0-L2 and the number of level shifts for this cell state combination may be 0+2=2.

One of the criteria that may be taken into consideration to maximize the bi-directional ECC protection within a programming cycle is that for each column or for each time that the parity cells are programmed, the number of level shifts should be minimized or reduced based on the number of parity values to be represented and the number of parity cells. For example in the $1^{st}$ column in FIG. 1, even if the level L3 can be used to establish a usable cell state combination, to minimize or reduce the number of level shift, L3 is not used until the $2^{nd}$ column.

In various embodiments, the relationship between the number of non-P0 parity values and the number of parity cells may be a factor that decides the number of level shifts for a column. In one embodiment, if the number of non-P0 parity values is less than or equal to the number of parity cells, all the non-P0 values may be represented by cell state combinations with one level shift at most. For example, in FIG. 2, there are three non-P0 parity values and there are three parity cells in the codeword. Therefore, for the first write, the maximum level shift is 0+0+1=1. In contrast, as illustrated in FIG. 1, there are three non-P0 parity values to be represented and there are only two parity cells in the codeword. Thus, for the first write, cell state combinations with level shifts equal to 1 which are L0-L1 and L1-L0 may not be enough to represent the three non-P0 parity values P1-P3. Therefore, cell state combinations with the number of level shifts equal to 2 may have to be employed, for example, L0-L2.

In another embodiment, for a given $K^{th}$ write there may be "a spread of level shifts" which may be the difference between the maximum and minimum numbers of level shifts for each column or each write. As illustrated in FIG. 1, for the first column, the maximum number of level shifts is 0+2=2 and the minimum number of level shifts is 0+0=0, thus the spread of level shifts may be 2−0=2.

In one embodiment, another one of the criteria to be taken into consideration may be that the spread of level shifts should be minimized or reduced in each column or each write based on the number of parity cells and the number of parity values. As illustrated in FIG. 2, for the $3^{rd}$ write, the spread of level shifts is (2+1+1)−(1+1+1)=1. Even though higher spread of level shifts may be used, however, in order to achieve maximum number of bi-directional ECC protection, the spread of level shifts for each write should be reduced as much as possible.

In various embodiments, one or more parity cells may reach the highest level and may not be further uni-directionally programmed within a programming cycle. In one embodiment, for a $k^{th}$ write, if a parity cell reaches the highest level in representing two or more parity values, then this parity cell may be exhausted and may no longer contribute to provide cell state combinations for bi-directional ECC protection. For example, as illustrated in FIG. 2, for the $5^{th}$ column, the second parity cell is at L3 only when representing P2 and the third parity cell is at L3 only when representing P1. Therefore, one more write may still be available to write any of the four parity values into the codeword within the same programming cycle. In contrast, for the $6^{th}$ column, the three parity cells are set to the fourth level L3 in representing three parity values. Thus, the three parity cells may no longer be further programmed to allow more writes. Therefore, even though for example in FIG. 2, the user may have the freedom to use L3 in the first four columns to represent parity values P0-P3, L3 is not used until the $5^{th}$ column to avoid early exhaustion of parity cells.

In various embodiments, for any kind of definition of cell state combinations, the number of level shifts of parity value P0 for the $1^{st}$ write may always be 0, which means that to represent P0 for the $1^{st}$ write every parity cell may have to be set to L0. In another embodiment, the cell state combinations representing any non-P0 parity values may be exchangeable with each other. For example, in FIG. 1, the row of cell state combinations representing P1 may be exchanged with the row representing P2 or P3.

Codewords in PCM devices may also include multiple parity cells and different cell state combinations may be employed similarly as above described so that the parity cells may be programmed uni-directionally for most of the time to eliminate the reliability issue.

Figure 4:
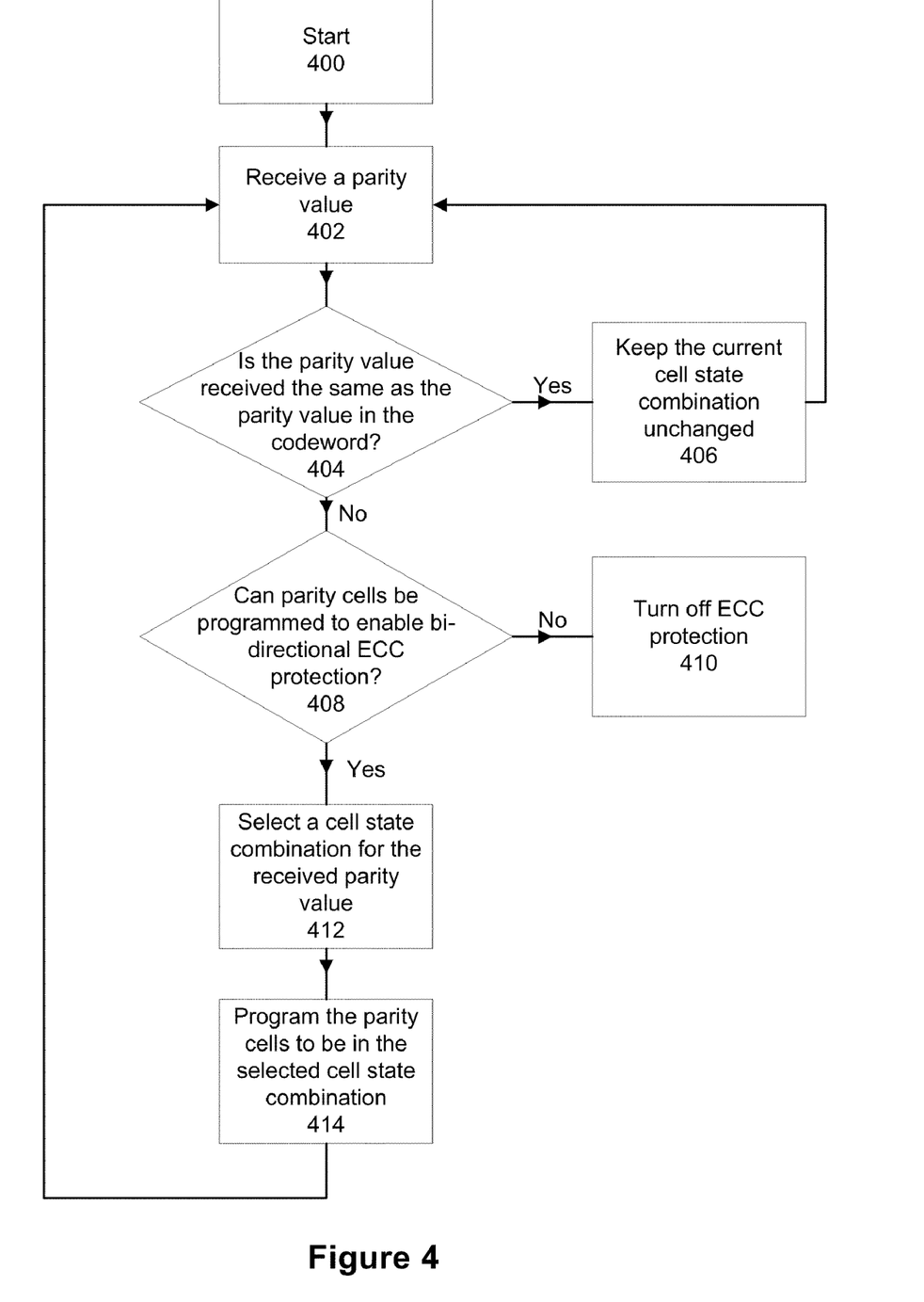
FIG. 4 illustrates a method for operating an NVM device with bi-directional ECC protection in accordance with an embodiment.

FIG. 4 is a flowchart depicting a method for a controller configured to operate an NVM device with bi-directional ECC protection within a programming cycle in accordance with various embodiments. A controller, as used herein, may be any type of controlling device/logic that may implement the following described operations, and the controller may include firmware, state machine or microcode, and so forth.

In one embodiment, the method started at block 400 and the controller may go to block 402 to receive a parity value reflecting a data value stored in a codeword and is supposed to be written to the plurality of multi-level parity cells of the same codeword to establish ECC protection. At block 404, the controller may determine that whether the parity value received is the same as the parity value currently existing in the codeword. At block 406, if the controller determines that the two values are the same, the parity cells may not have to be programmed and the current cell state combination may be kept to represent the same parity value.

At block 404, if the controller determines that the two parity values are not the same, then the controller may go further to block 408. In one embodiment, if there is no parity value currently existing in the codeword, the controller may also go to block 408.

At block 408, the controller may determine that if the parity cells can be programmed to enable bi-directional ECC protection. A plurality of parity values may be represented by a plurality of cell state combinations of the parity cells of the codeword. In one embodiment, if the controller determines at block 408 that not every one of the plurality of parity values may be represented by a cell state combination in the next programming iteration, then the controller may go to block 410 and turn off the ECC protection.

At block 408, if the controller determines that the parity cells may be further programmed to enable bi-directional ECC protection, the controller may go to block 412 and select a cell state combination to represent the received parity value. Such a selection may be based on the received parity value itself and the current cell state combination at which the parity cells were programmed to be. In one embodiment, the possible parity values may form a sequence and the received parity value to be written to the codeword can be either prior to or posterior to the parity value existing in the codeword. Once the cell state combination for the received parity value is selected, the controller may go to block 414 to uni-directionally program the parity cells to be in the selected cell state combination.

Figure 5:
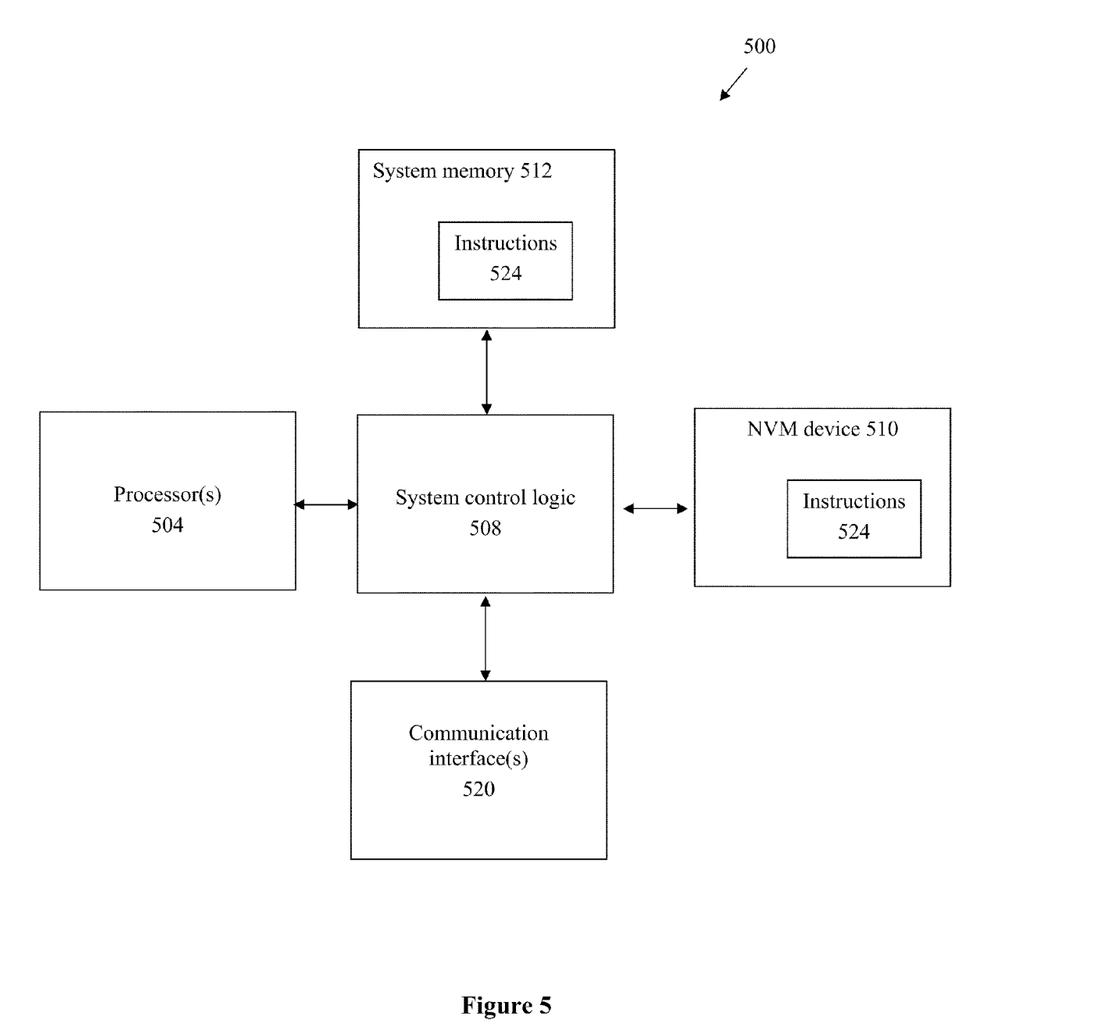
FIG. 5 illustrates a host device incorporating an NVM device with bi-directional ECC protection in accordance with an embodiment.

FIG. 5 illustrates a host device 500 that may host the NVM device 510 in accordance with some embodiments. The host device 500 may include one or more processor(s) 504; system control logic 508 coupled to at least one of the processor(s) 504; system memory 512 coupled to the system control logic 508; the NVM device 510 coupled to the system control logic 508; and one or more communication interface(s) 520 coupled to the system control logic 508.

System control logic 508 for one embodiment may include any suitable interface controllers to provide for any suitable interface to the components with which it is coupled. The system control logic 508 may include the controller described above to operate the NVM device 510.

System memory 512 may be used to load and/or store data/instructions, for example, for the host device 500. System memory 512 may include any suitable volatile memory, such as, but not limited to, suitable dynamic random access memory (DRAM).

The NVM device 510 may also be used to load and/or store data/instructions, for example, for the host device 500. The NVM device 510 may include any suitable non-volatile memory, such as, but not limited to, NOR flash memory, NAND flash memory, phase change memory, etc.

In some embodiments, instructions 524 may, when executed by the processor(s) 504, result in the host device 500 and/or the NVM device 510 performing at least some of the operations described above. The instructions may be located in the NVM device 510 and/or the system memory 512. In some embodiments, the instructions 524 may additionally/alternatively be located in the system control logic 508.

Communication interface(s) 520 may provide an interface for the host device 500 to communicate over one or more networks and/or with any other suitable device. Communication interface(s) 520 may include any suitable hardware and/or or firmware. Communication interface(s) 520 for one embodiment may include, for example, a network adapter, a wireless network adapter, a telephone modem, and/or a wireless modem. For wireless communications, communication interface(s) 520 for one embodiment may use one or more antennas.

For one embodiment, at least one of the processor(s) 504 may be packaged together with logic for one or more controllers of system control logic 508. For one embodiment, at least one processor of the processor(s) 504 may be packaged together with logic for one or more controllers of system control logic 508 to form a System in Package (SiP). For one embodiment, at least one processor of the processor(s) 504 may be integrated on the same die with logic for one or more controllers of system control logic 508. For one embodiment, at least one processor of the processor(s) 504 may be integrated on the same die with logic for one or more controllers of system control logic 508 to form a System on Chip (SoC).

In various embodiments, the host device 500 may be a desktop or laptop computer, a server, a set-top box, a digital recorder, a game console, a personal digital assistant, a mobile phone, a digital media player, a digital camera, etc. The host device 500 may have more or less components and/or different architectures.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present disclosure. Similarly, memory devices of the present disclosure may be employed in host devices having other architectures. This application is intended to cover any adaptations or variations of the embodiments discussed herein. Therefore, it is manifestly intended that embodiments in accordance with the present disclosure be limited only by the claims and the equivalents thereof.

What is claimed is:

1. A method, comprising:
writing, in a first programming iteration, a first parity value of a plurality of parity values to a plurality of multilevel parity cells device by level shifting at least one of the plurality of multilevel parity cells in a first direction, the plurality of parity values having an ascending sequence order; and writing in a second programming iteration, a second parity value of the plurality of parity values to the plurality of multilevel parity cells by level shifting at least one of the plurality of multilevel parity cells in the first direction, the second parity value occurring earlier in the ascending sequence order than the first parity value and the second programming iteration occurs after the first programming iteration without an intervening erase operation.

2. The method of claim 1, further comprising: writing, in a third programming iteration, a third parity value of the plurality of parity values to the plurality of multilevel parity cells by level shifting at least one of the plurality of multilevel parity cells in the first direction, wherein the third parity value is later in the ascending sequence order than the second parity value and the third programming iteration occurs after the second programming iteration without an intervening erase operation.

3. The method of claim 1, wherein the plurality of multilevel parity cells are of a non-volatile memory (NVM) device, and the NVM device is a flash memory device or a phase change memory (PCM) device.

4. The method of claim 1, wherein the plurality of multilevel parity cells can be written a plurality of times without an intervening erase iteration and for each of the plurality of times there is a cell state combination that represents each of the plurality of parity values.

5. The method of claim 4, wherein a sum of states for each cell state combination for each of the plurality of times is reduced based at least in part on a number of the plurality of multilevel parity cells in the codeword and a number of the plurality of parity values represented by the plurality of cell state combinations.

6. The method of claim 5, wherein a difference between the sum of states for each of the cell state combinations for each of the plurality of times is reduced based at least in part on the number of the plurality of multilevel parity cells in the codeword and the number of the plurality of parity values represented by the plurality of cell state combinations.

7. The method of claim 1, wherein the first and second parity values are written to reflect at least portions of first and second data values stored in the codeword respectively.

8. An apparatus comprising memory having instructions that, when executed, cause the apparatus to: write, in a first programming iteration, a first parity value of a plurality of parity values to a plurality of multilevel parity cells of a non-volatile memory (NVM) device by level shifting at least one of the plurality of multilevel parity cells in a first direction, the plurality of parity values having an ascending sequence order; and write, in a second programming iteration, a second parity value of the plurality of parity values to the plurality of multilevel parity cells by level shifting at least one of the plurality of multilevel parity cells in the first direction, the second parity value occurring earlier in the ascending sequence order than the first parity value and the second programming iteration occurs after the first programming iteration without an intervening erase operation.

9. The apparatus of claim 8, wherein the instructions, when executed, further cause the apparatus to: write, in a third programming iteration, a third parity value of the plurality of parity values to the plurality of multilevel parity cells by level shifting at least one of the plurality of multilevel parity cells in the first direction, wherein the third parity value is later in the ascending sequence order than the second parity value and the third programming iteration occurs after the second programming iteration without an intervening erase operation.

10. The apparatus of claim 8, wherein the plurality of multilevel parity cells are of a non-volatile memory (NVM) device, and the NVM device is a flash memory device or a phase change memory (PCM) device.

11. The apparatus of claim 8, wherein the plurality of multilevel parity cells can be written a plurality of times without an intervening erase iteration and for each of the plurality of times there is a cell state combination that represents each of the plurality of parity values.

12. The apparatus of claim 11, wherein a sum of states for each cell state combination for each of the plurality of times is reduced based at least in part on a number of the plurality of multilevel parity cells in the codeword and a number of the plurality of parity values represented by the plurality of cell state combinations.

13. The apparatus of claim 12, wherein a difference between the sum of states for each of the cell state combination for each of the plurality of times is reduced based at least in part on the number of the plurality of multilevel parity cells in the codeword and the number of the plurality of parity values represented by the plurality of cell state combinations.

14. The apparatus of claim 13, wherein the first and second parity values are written to reflect at least portions of first and second data values stored in the codeword respectively.

15. A non-volatile memory (NVM) device, comprising: a plurality of codewords, each of the plurality of codewords including: a plurality of data cells configured to store a data value in the codeword; and a plurality of parity cells configured to be programmed to write in a first and a second parity value from a plurality of parity values in a first and a second programming iteration respectively by level shifting at least one of the plurality of parity cells in a first direction; wherein the second programming iteration occurs after the first programming iteration without any intervening erase operation, and the second parity value occurring earlier than the first parity value in an ascending sequence order formed by the plurality of parity values.

16. The NVM device of claim 15, wherein the plurality of multilevel parity cells are further configured to write a third parity value in a third programming iteration by level shifting at least one of the plurality of multilevel parity cells in the first direction, wherein the third parity value is later in the ascending sequence order than the second parity value and the third programming iteration occurs after the second programming iteration without an intervening erase operation.

17. The NVM device of claim 16, wherein the plurality of multilevel parity cells are of a non-volatile memory (NVM) device, and the NVM device is a flash memory device or a phase change memory (PCM) device.

18. The NVM device of claim 17, wherein the plurality of multilevel parity cells are capable of being invalidated when a first one of the plurality of multilevel parity cells is programmed to be at a highest level in representing the plurality of parity values.

\* \* \* \* \*

UNITED STATES PATENT AND TRADEMARK OFFICE
CERTIFICATE OF CORRECTION

| | | |
|---|---|---|
| PATENT NO. | : 8,286,066 B2 | Page 1 of 1 |
| APPLICATION NO. | : 12/467965 | |
| DATED | : October 9, 2012 | |
| INVENTOR(S) | : Christopher Bueb et al. | |

It is certified that error appears in the above-identified patent and that said Letters Patent is hereby corrected as shown below:

In column 7, line 38, in Claim 1, after "cells" delete "device".

In column 8, line 67, in Claim 15, after "plurality of" insert -- multilevel --.

In column 9, line 4, in Claim 15, after "plurality of" insert -- multilevel --.

Signed and Sealed this
Twenty-ninth Day of January, 2013

David J. Kappos
*Director of the United States Patent and Trademark Office*